(12) United States Patent
Hosoda et al.

(10) Patent No.: US 10,278,293 B2
(45) Date of Patent: Apr. 30, 2019

(54) ELECTRONIC DEVICE

(71) Applicant: NIHON DEMPA KOGYO CO., LTD., Tokyo (JP)

(72) Inventors: Tomoyuki Hosoda, Saitama (JP); Junichi Arai, Saitama (JP)

(73) Assignee: NIHON DEMPA KOGYO CO., LTD., Tokyo (JP)

(*) Notice: Subject to any disclaimer, the term of this patent is extended or adjusted under 35 U.S.C. 154(b) by 0 days.

(21) Appl. No.: 15/614,618

(22) Filed: Jun. 6, 2017

(65) Prior Publication Data

US 2017/0359906 A1 Dec. 14, 2017

(30) Foreign Application Priority Data

Jun. 10, 2016 (JP) ................................. 2016-115841

(51) Int. Cl.

| H05K 3/34 | (2006.01) |
|---|---|
| H01L 23/049 | (2006.01) |
| H03B 5/32 | (2006.01) |
| H03H 3/02 | (2006.01) |
| H03H 9/02 | (2006.01) |

(52) U.S. Cl.
CPC ......... H05K 3/3442 (2013.01); H01L 23/049 (2013.01); H03B 5/32 (2013.01); H03H 3/02 (2013.01); H03H 9/02 (2013.01)

(58) Field of Classification Search
CPC ............................ H05K 3/3442; H01L 23/049
USPC ........ 439/65, 69, 74, 66; 361/760, 792–795; 174/260
See application file for complete search history.

(56) References Cited

U.S. PATENT DOCUMENTS

| 4,791,075 A * | 12/1988 | Lin ...................... H01L 23/057 174/50.51 |
|---|---|---|
| 5,548,486 A * | 8/1996 | Kman ..................... H01R 12/58 361/744 |
| 5,878,483 A * | 3/1999 | Kman ..................... H01R 12/58 29/739 |
| 5,938,455 A * | 8/1999 | Glovatsky .............. H01R 12/58 439/290 |
| 7,586,754 B2 * | 9/2009 | Kawamura .......... H05K 3/3442 174/259 |
| 10,043,717 B2 * | 8/2018 | Arai ................ H01L 21/823807 |
| 2002/0043726 A1 * | 4/2002 | Salman ................... H01L 23/13 257/778 |
| 2005/0230825 A1 * | 10/2005 | Akram .................... H01L 23/13 257/737 |
| 2005/0263322 A1 * | 12/2005 | Mickievicz ............ H05K 1/112 174/260 |
| 2006/0084291 A1 * | 4/2006 | Hironobu ............. H05K 3/3405 439/74 |

(Continued)

FOREIGN PATENT DOCUMENTS

JP 2008263407 10/2008

*Primary Examiner* — James Harvey
*Assistant Examiner* — Oscar C Jimenez
(74) *Attorney, Agent, or Firm* — JCIPRNET (57) ABSTRACT

An electronic device includes a first board, a second board, and support pillars. The support pillars hold the first board and the second board mutually separated. The first board has a first surface on which an electronic component is mounted. The first board has a second surface that includes depressed portions into which the support pillars extending from the second board are inserted.

3 Claims, 7 Drawing Sheets

(56) References Cited

U.S. PATENT DOCUMENTS

| | | | | |
|---|---|---|---|---|
| 2008/0079505 A1* | 4/2008 | Kuroda | ............... | H05K 1/144 |
| | | | | 331/68 |
| 2013/0335936 A1* | 12/2013 | Yamamoto | ........ | H01L 23/49827 |
| | | | | 361/760 |
| 2014/0035118 A1* | 2/2014 | Bayerer | ............... | H01L 23/049 |
| | | | | 257/690 |
| 2015/0146393 A1* | 5/2015 | Uzoh | ............... | H01L 23/49827 |
| | | | | 361/760 |

* cited by examiner

ELECTRONIC DEVICE

CROSS-REFERENCE TO RELATED APPLICATIONS

This application is based on and claims priority under 35 U.S.C. § 119 to Japanese Patent Application No. 2016-115841, filed on Jun. 10, 2016, the entire content of which is incorporated herein by reference.

TECHNICAL FIELD

This disclosure relates to an electronic device.

DESCRIPTION OF THE RELATED ART

Electronic equipment used for computers, mobile terminals, and base stations includes many electronic devices. As the electronic device, there are known a crystal unit and an oscillator that include a piezoelectric vibrating piece, such as a quartz crystal piece. As one of such electronic devices, there is known a configuration of a temperature-controlled type high-stability piezoelectric oscillator in which electronic components are mounted on an electronic circuit board (a first board), and the electronic circuit board is held separated from a base board (a second board) with support pillars (for example, see Japanese Unexamined Patent Application Publication No. 2008-263407).

In the electronic device having this configuration, the electronic circuit board includes through holes that pass through in a thickness direction. On a front surface (one principal surface, a first surface) of this electronic circuit board, the electronic components, a wiring pattern, and connection electrodes are disposed. The wiring pattern is electrically connected to the electronic components. The connection electrodes are electrically connected to the wiring pattern and formed in peripheral regions of the through holes. A part of a side surface of the support pillar includes a flange shaped stopper, which is formed projecting from the side surface. When the support pillar is inserted in the through hole of the electronic circuit board, the stopper is locked with a back surface (the other principal surface, a second surface) of the electronic circuit board. In this respect, a distal end portion of the support pillar is in a state of projecting from the surface of the electronic circuit board. In this state, the support pillar is bonded to the electronic circuit board via a conductive adhesive disposed on a peripheral surface of the distal end portion and on the connection electrode.

However, the electronic device with the above-described configuration has a reduced region for mounting the electronic components and for forming the wiring pattern on the surface of the electronic circuit board due to the through holes and the connection electrodes disposed on predetermined positions on the surface of the electronic circuit board. This limits the electronic components that are includable in the electronic device and causes difficulty in forming a desired wiring pattern.

A need thus exists for an electronic device which is not susceptible to the drawback mentioned above.

SUMMARY

According to a first aspect of this disclosure, there is provided an electronic device. The electronic device includes a first board, a second board, and support pillars. The support pillars hold the first board and the second board mutually separated. The first board has a first surface on which an electronic component is mounted. The first board has a second surface that includes depressed portions into which the support pillars extending from the second board are inserted.

BRIEF DESCRIPTION OF THE DRAWINGS

The foregoing and additional features and characteristics of this disclosure will become more apparent from the following detailed description considered with reference to the accompanying drawings, wherein:

FIG. 1A and FIG. 1B illustrate an exemplary electronic device according to a first embodiment, FIG. 1A is a plan view, and FIG. 1B is a schematic cross-sectional view taken along a line IB-IB in FIG. 1A;

DETAILED DESCRIPTION

The following describes embodiments of this disclosure with reference to the drawings. It will be understood that the scope of the disclosure is not limited to the described embodiments. A scale of an expressed drawing is adjusted to explain the following embodiments. For example, a part of a drawing is enlarged or stressed as required when it is described. Each of the following drawings uses an XYZ coordinate system to describe directions in the drawings. In this XYZ coordinate system, a plane parallel to a top surface of an electronic device is assumed to be an XZ-plane. A direction perpendicular to the XZ-plane (a thickness direction of an electronic device 100 or similar device) is indicated as a Y-direction. It is described that a directions pointed by an arrow in the drawings is assumed to be a + direction in each of X, Y, and Z-directions. The direction opposite of the arrow direction is assumed to be a − direction.

First Embodiment

Figure 1A:
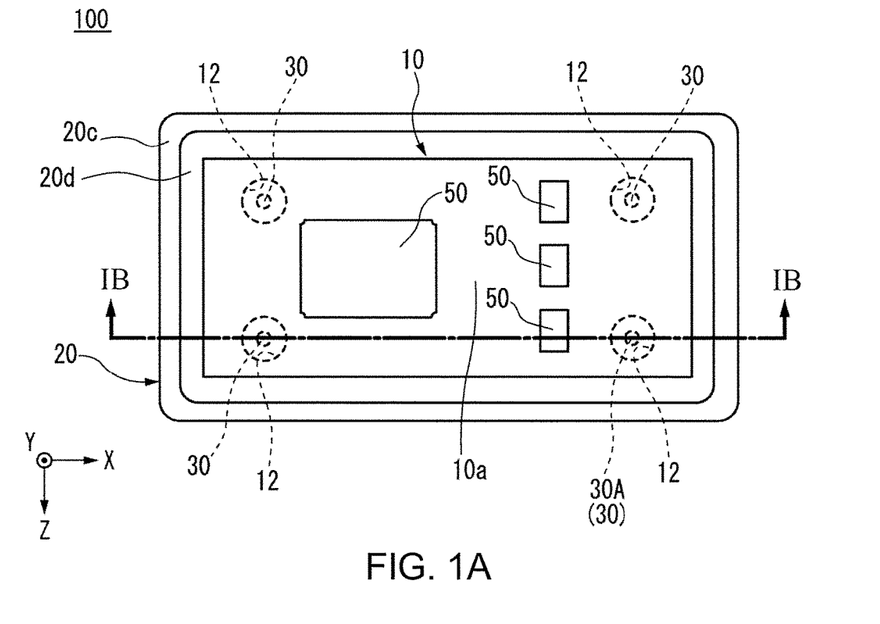
Figure 1B:
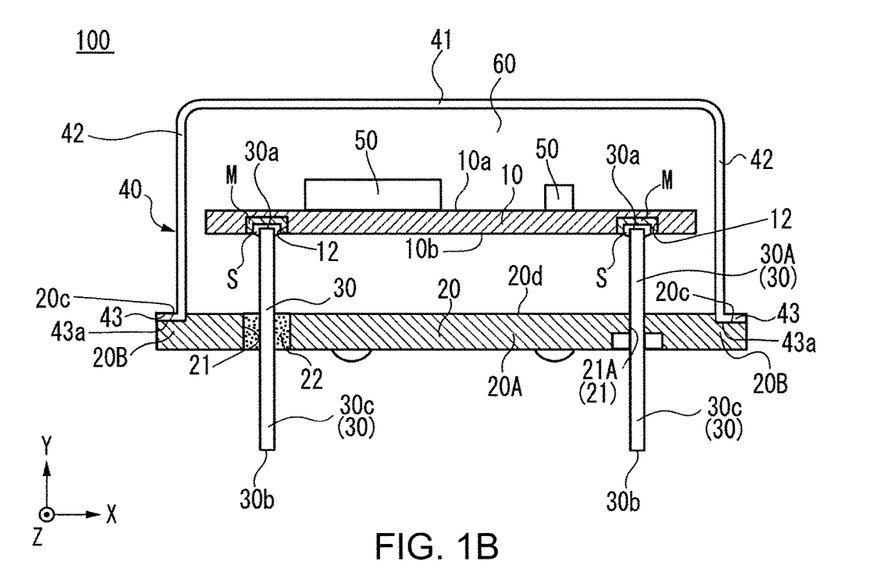

An example of the electronic device 100 according to an embodiment will be described using the drawings. FIG. 1A is a plan view illustrating the example of the electronic device 100. FIG. 1B is a schematic cross-sectional view taken along a line IB-IB in FIG. 1A. In FIG. 1A, a cover 40, which will be described later, is transparently illustrated. In FIG. 1A and FIG. 1B, a wiring pattern 11 and an extraction electrode 13, which will be described later, are omitted. The electronic device 100 is an oven controlled crystal oscillator (OCXO) that keeps an ambient temperature of a crystal resonator at constant. The same applies to another embodiment described later. The electronic device 100 has a configuration of a so-called lead inserting type (Through Hole Device: THD). The electronic device 100 includes a first board 10, a second board 20, support pillars 30, and the cover 40 as illustrated in FIG. 1A and FIG. 1B.

The first board 10 is held separated from the second board 20 with the support pillars 30 that extend from the second board 20. The first board 10 is disposed parallel with the second board 20. The first board 10 is formed in an approximately rectangular-plate shape. A longitudinal direction of the first board 10 is parallel with the X-direction. A short side direction of the first board 10 is parallel with the Z-direction. As the first board 10, a glass epoxy board is used, however, the first board 10 is not limited to the glass epoxy board, and a ceramic board, a glass board, a mold resin board, or similar board may be used. The first board 10 has a first surface 10a and a second surface 10b that is different from the first surface 10a.

The first surface 10a is a surface (a principal surface) of the first board 10 on a +Y-side. The first surface 10a includes the wiring pattern 11 (see FIG. 2). The wiring pattern 11 has, for example, a configuration of a metal film similar to a metal film M formed on a depressed portion 12, which will be described later. The wiring pattern 11 is formed by a film forming method similar to forming this metal film M.

On the first surface 10a, electronic components 50 are mounted. The electronic components 50 include a piezoelectric device and a semiconductor device, such as a crystal resonator, an oscillator circuit, a heater, a temperature sensor, and a temperature control circuit. These electronic components 50 are electrically connected to the wiring pattern 11.

The second surface 10b is a surface on the opposite side of the first surface 10a in the first board 10 and is a surface (a principal surface) on a −Y-side. The second surface 10b faces surfaces 20d and 20c of the second board 20, which will be described later, on the +Y-side. The second surface 10b includes the depressed portions 12 at, for example, four corner portions. On the second surface 10b, the electronic components may be mounted. In this case, the second surface 10b may include the wiring pattern that is electrically connected to the electronic components.

Figure 2:
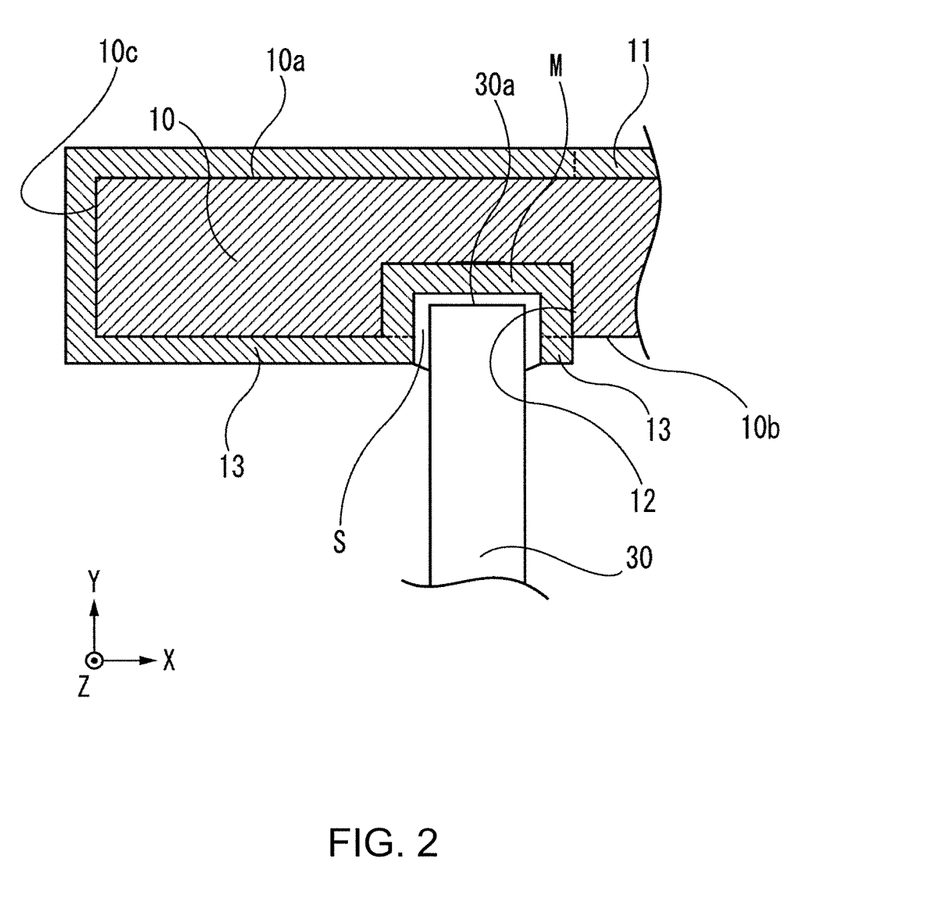
FIG. 2 is a cross-sectional view of a main part of the electronic device illustrated in FIG. 1A and FIG. 1B.

FIG. 2 is a cross-sectional view of a main part of the electronic device 100 illustrated in FIG. 1A and FIG. 1B. FIG. 2 illustrates a part including the depressed portion 12 of the first board 10 on a −X-side and +Z-side. The following describes a configuration of this depressed portion 12, and the same applies to the other three depressed portions 12. As illustrated in FIG. 2, the depressed portion 12 is in a circular shape viewing from the Y-direction and in a tubular shape that extends to the +Y-side from the second surface 10b. The shape of the depressed portion 12 viewed from the Y-direction is not limited to the circular shape and may be, for example, a rectangular shape. The same applies to shapes of a depressed portion 112 and similar portion according to modifications described later.

The depressed portion 12 has a configuration of a non-through hole that does not pass through the first board 10. Such depressed portion 12 may be formed by preparing one board that includes a through hole passing through a thickness direction (the Y-direction) and by bonding another board onto the +Y-side of the one board. In this case, the through hole corresponds to an inner side surface (an inner peripheral surface) of the depressed portion 12. The depressed portion 12 may be formed by processing the second surface 10b of the first board 10 using a method, such as a mechanical processing and a thermal processing.

The depressed portion 12 is formed such that the support pillar 30 is insertable from its distal end. In the depressed portion 12, a distal end 30a of the support pillar 30 extending in the +Y-direction from the second board 20 is inserted. The depressed portion 12 includes the metal film M having a conductive property over a whole internal surface. That is, the metal film M is formed on the inner side surface of the depressed portion 12 and a surface of the bottom surface. This metal film M is electrically connected to the wiring pattern 11 via the extraction electrode 13, which will be described later. The metal film M is made of copper plating. Metal that constitutes the metal film M may be gold, argentum, or similar metal, instead of copper. This metal film M may be formed by a method such as printing via a metal mask, sputtering, and vacuum evaporation, instead of plating.

The first board 10 includes the extraction electrode 13. The extraction electrode 13 is an electrode that electrically connects the wiring pattern 11 to the metal film M. The extraction electrode 13 is formed by being routed from the first surface 10a to the second surface 10b. The extraction electrode 13 is extracted from the wiring pattern 11 and formed to the metal film M via a side surface (a surface on the −X-side in FIG. 2) of the first board 10. The extraction electrode 13 may have a configuration including a castellation electrode. That is, on a part of a side surface 10c of the first board 10, a castellation that is notched inward is disposed. The extraction electrode 13 may be routed via this castellation. The extraction electrode 13 has a configuration similar to the metal film M and is formed by the film forming method similar to forming the metal film M. The extraction electrode 13 is formed by being integrally deposited with the wiring pattern 11 and the metal film M.

Figure 3A:
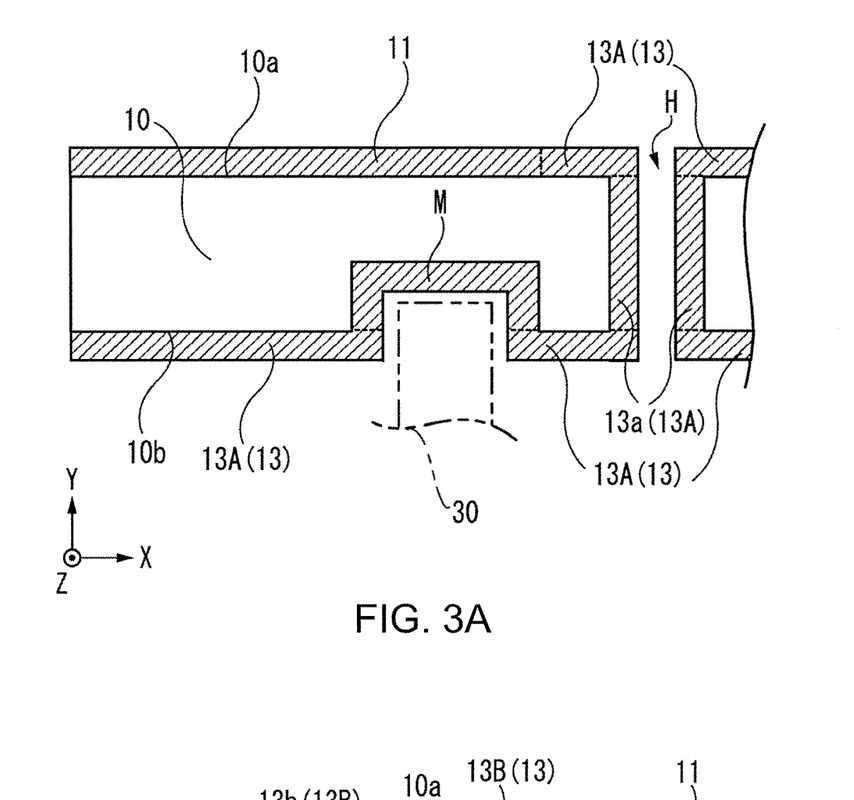
FIG. 3A and FIG. 3B are cross-sectional views illustrating another configuration of a main part of the electronic device illustrated in FIG. 1A and FIG. 1B.
Figure 3B:
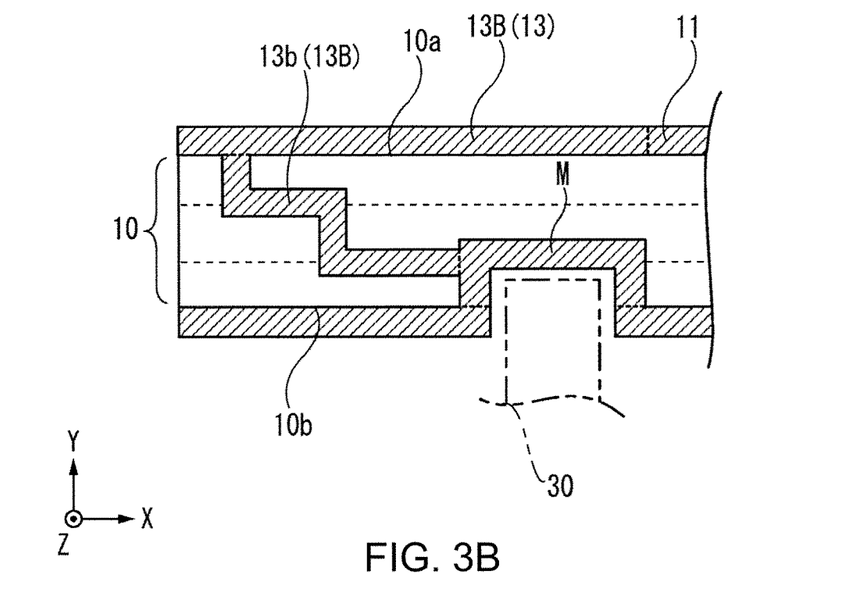

Such the extraction electrode 13, which electrically connects the wiring pattern 11 to the metal film M, is not limited to having a configuration of a so-called end face through in which the electrode is routed via the side surface 10c as described above. FIG. 3A and FIG. 3B are cross-sectional views illustrating another configuration of the extraction electrode 13. In FIG. 3A and FIG. 3B, the first board 10 is illustrated without hatching.

The extraction electrode 13 may have a configuration including a through electrode. In this case, for example, as illustrated in FIG. 3A, the first board 10 includes a through hole H that passes through from the first surface 10a to the second surface 10b. This through hole H includes a through electrode 13a. The through electrode 13a is formed by depositing a metal film on a surface (a peripheral surface) of the through hole H. The through electrode 13a may be formed by being simultaneously and integrally deposited with the wiring pattern 11 and the metal film M. The through electrode 13a is not limited to having the above-described configuration, but may be formed by, for example, filling the through hole H with a metal paste, such as copper and argentum. An extraction electrode 13A is configured to include the through electrode 13a. Such configuration of the extraction electrode 13A reduces a freedom of arranging the wiring pattern 11 and mounting the electronic components 50 on the surface of the first board 10 due to the formation of the through hole H on the surface of the first board 10. However, the support pillar 30 or similar part is not inserted in the through hole H and the through hole H only needs a diameter inside which the through electrode 13a is formable. A freedom of choosing a formation position of the through hole H in the first board 10 is high compared with a freedom of choosing an arrangement position of the support pillar 30. In consideration of these, it is considered that an influence that the formation of the through hole H has on the arrangement of the wiring pattern 11 and the mounting of the electronic components 50 is small.

The extraction electrode 13 may have a configuration including an internal layer pattern of a multiwall board. In this case, for example, as illustrated in FIG. 3B, the first board 10 is a multiwall board and includes an internal layer pattern 13b. An extraction electrode 13B is configured to include the internal layer pattern 13b. The internal layer pattern 13b connects the front surface 10a (which is also referred to as "first surface 10a") of the first board 10 to the metal film M. While the extraction electrode 13B illustrated in FIG. 3B is once extracted to the −X-side along the front surface 10a from the wiring pattern 11, the extraction electrode 13B may be configured to be extracted to the −Y-side from the wiring pattern 11. That is, the wiring pattern 11 and the internal layer pattern 13b may be configured to be directly connected. Such configuration of the extraction electrode 13B includes the internal layer pattern 13b. Therefore, it is easy to decrease a formation region for the extraction electrode 13 compared with the configuration of the end face through and the configuration including a through electrode described above on a surface of the first board 10. Accordingly, ensuring the formation region for the wiring pattern 11 and a mounting region for the electronic components 50 on the surface of the first board 10 is easy.

Referring again to FIG. 1A and FIG. 1B, the second board 20 is formed in an approximately rectangular-plate shape using a metallic material having a conductive property, such as iron and kovar (alloy of iron, nickel, and cobalt). The second board 20 may be formed of resin, ceramic, glass, or similar material, instead of metal. A longitudinal direction of the second board 20 is parallel with the X-direction. A short side direction of the second board 20 is parallel with the Z-direction. The second board 20 is configured to include a central portion 20A and a surrounding edge portion 20B. The central portion 20A has a surface on the +Y-side projecting to the +Y-side with respect to a peripheral portion. The surrounding edge portion 20B surrounds the central portion 20A. The surface 20c on the +Y-side of the surrounding edge portion 20B is a bonding surface on which the cover 40 is bonded. The surface 20d on the +Y-side of the central portion 20A and the bonding surface 20c are both parallel with the XZ-plane.

The second board 20 (the central portion 20A) includes, for example, four through holes 21 that pass through the second board 20 in the thickness direction (the Y-direction). The through holes 21 are disposed on the four respective corner portions of the central portion 20A and formed such that the support pillars 30 are insertable. A through hole 21A on the +X-side and +Z-side among these four through holes 21 is airtightly sealed by being welded in a state where support pillar 30A are inserted. This secures the support pillar 30A to the second board 20 and electrically connects the support pillar 30A to the second board 20. The support pillar 30A has a configuration of a so-called ground pin and is connected to the ground. In view of this, the support pillar 30A being electrically connected to the cover 40 via the second board 20 electromagnetically shields the electronic components 50. The other three through holes 21 among the above-described four through holes 21 are filled with a sealing material 22 after the support pillars 30 are inserted. This hermetically seals the through holes 21. This hermetic sealing secures the support pillars 30 to the second board 20. As the sealing material 22, a material having a non-conductive property, such as a glass material and a resin material, is used. This prevents the support pillars 30 and the second board 20 from electrically connected.

The electronic device 100 includes, for example, four support pillars 30. The support pillars 30 are formed linearly extending in the Y-direction. While the support pillar 30 is in a columnar shape, the shape of the support pillar 30 is not limited to the columnar shape, and may be in a prismatic shape or similar shape. As the support pillar 30, the metallic material having a conductive property, such as the alloy of copper, iron, and nickel, kovar, and stainless steel, is used.

The support pillar 30 passes through the second board 20 in the Y-direction. The distal end 30a of the support pillar 30 on the +Y-side is inserted in the depressed portion 12 of the first board 10. In this state, the support pillar 30 does not pass through the first board 10 and is not exposed from the first surface 10a. The distal end portion including the distal end 30a of the support pillar 30 on the +Y-side is bonded to the depressed portion 12 with a solder S. This physically connects the first board 10 to the second board 20 via the support pillar 30 in a state of being separated from one another by a predetermined interval and relatively positioned. The support pillar 30 is electrically connected to the metal film M via the solder S. This electrically connects the support pillar 30 to the wiring pattern 11 via the metal film M and the extraction electrode 13 (see FIG. 2). For the bonding of the support pillar 30 and the depressed portion 12 and the electrical connection of the support pillar 30 and the metal film M, a conductive adhesive constituted of, for example, a conductive resin may be used instead of the solder S. The same applies to other embodiments and modifications, which will be described later.

A portion of the support pillar 30 that extends in the +Y-direction toward the first board 10 from the central portion 20A of the second board 20 is a portion to hold the first board 10 and is an inner lead of the electronic device 100. A portion of the support pillar 30 that projects to the −Y-side and extends in the −Y-direction from the second board 20 is an outer lead 30c of the electronic device 100.

The cover 40 includes a planar portion (a surface on the +Y-side) 41, a tubular trunk portion 42, and a collar portion 43. The tubular trunk portion 42 extends in the −Y-direction from a peripheral area of the planar portion 41. The collar portion 43 projects outward from an end portion in the −Y-side of the trunk portion 42. The trunk portion 42 is formed so as to be fittable to the surrounding edge portion 20B of the second board 20. On a surface of the collar portion 43 on the −Y-side, a bonding surface 43a that is bonded to the bonding surface 20c of the second board 20 is formed. The bonding surface 20c of the second board 20 and the bonding surface 43a of the cover 40 are bonded by resistance welding, such as seam welding and spot welding.

Bonding the second board 20 and the cover 40 forms a housing space 60. The housing space 60 houses the first board 10 and may be configured to contain an inert gas atmosphere, such as a vacuum atmosphere and a nitrogen gas. The second board 20 and the cover 40 may be bonded using various kinds of bonding materials instead of the weld bonding.

With such configuration of the electronic device 100 according to the embodiment, the support pillar 30 does not pass through the first board 10 and is not exposed from the first surface 10a even though the support pillar 30 is inserted into the depressed portion 12 of the second surface 10b. In view of this, a region on the first surface 10a that overlaps the support pillar 30 as viewed from the Y-direction can be used for disposing the wiring and the electronic components 50.

This enlarges an area usable for forming the wiring pattern 11 and mounting the electronic components 50 on the first surface 10a. Accordingly, types and the number of the wiring patterns 11 that are employable and the electronic components 50 that are includable can be increased in the electronic device 100. Wiring the wiring pattern 11 avoiding the support pillars 30 is no longer necessary. In view of this, a wiring route can be set shorter, thereby ensuring a reduced deterioration of a signal.

In the electronic device 100, the interval between the first board 10 and the second board 20 is adjustable by changing lengths of the inner leads of the support pillars 30 as necessary. In view of this, forming a flange shaped stopper in the support pillar 30 is not necessary, thereby ensuring a reduced manufacturing cost of the support pillar 30, and eventually a reduced manufacturing cost of the electronic device 100.

Figure 4A:
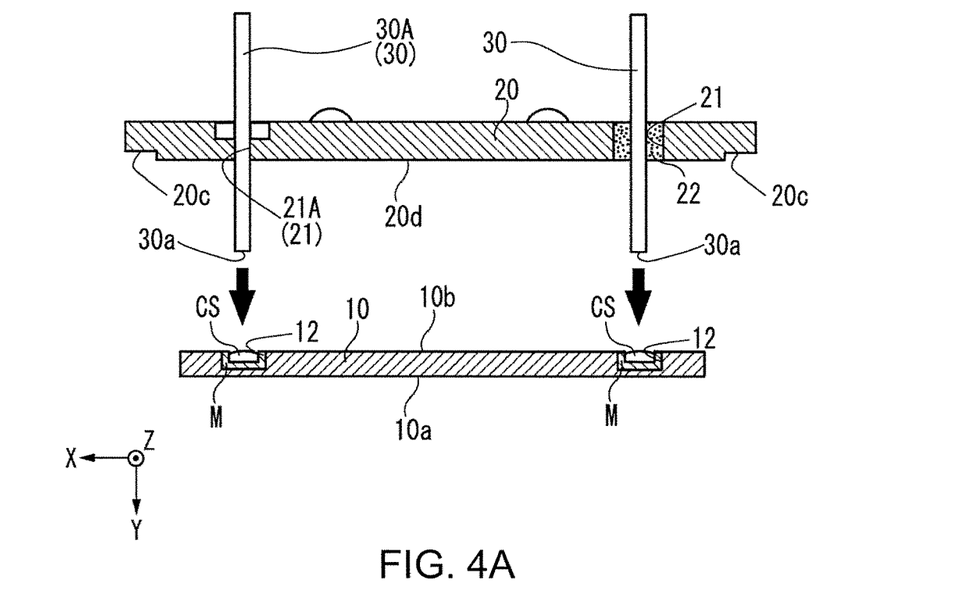
FIG. 4A and FIG. 4B are drawings illustrating a part of a manufacturing process for the electronic device illustrated in FIG. 1A and FIG. 1B.
Figure 4B:
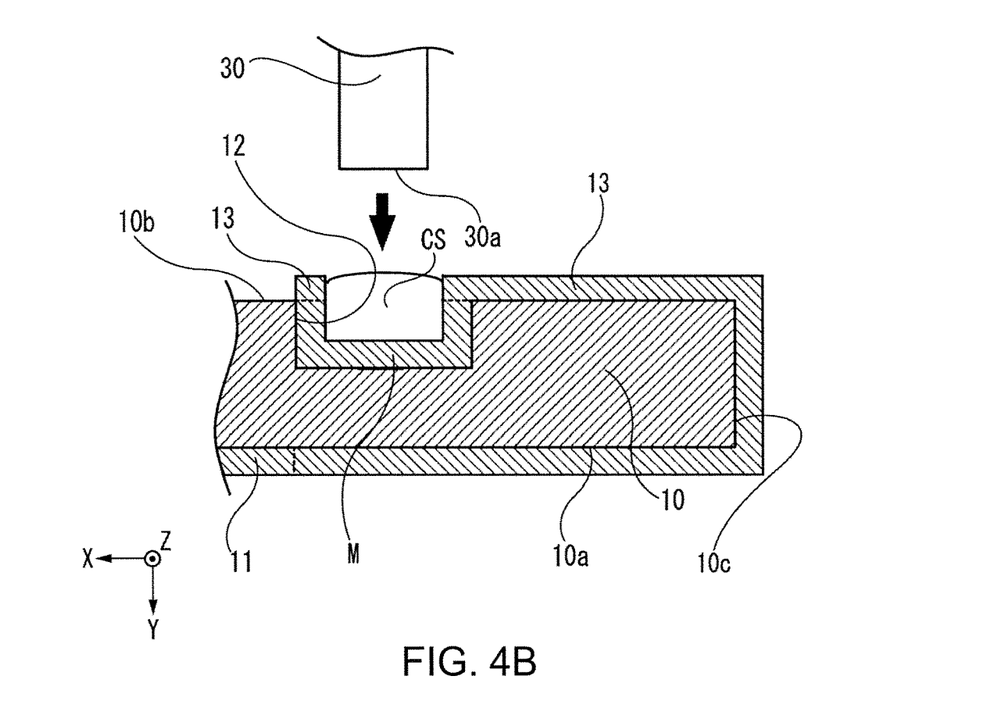

Next, an example of a manufacturing process for the electronic device 100 will be described. FIG. 4A and FIG. 4B are drawings illustrating a part of the manufacturing process for the electronic device 100. First, the electronic device 100 has the support pillars 30 inserted into the respective through holes 21 formed in the second board 20. In this state, the support pillar 30A is installed to the second board 20 by the resistance welding and the other support pillars 30 are installed by a glass hermetic sealing technique.

Next, as illustrated in FIG. 4A and FIG. 4B, the first board 10 is brought into a state of being upside down. This brings the first board 10 to have the second surface 10b facing upward. In this state, a pastelike cream solder CS is disposed in the depressed portion 12. This arrangement of the cream solder CS is performed by printing via, for example, a metal mask. In this respect, since the depressed portion 12 has the configuration of the non-through hole, the cream solder CS does not flow out to a surface on a lower side (the +Y-side) of the first board 10 via the depressed portion 12.

Subsequently, in a state where the surfaces 20c and 20d of the second board 20 facing the second surface 10b of the first board 10, the first board 10 and the second board 20 are brought relatively close and the distal ends 30a of the support pillars 30 are inserted into the depressed portions 12.

Subsequently, a reflow process is performed in a state where the support pillars 30 are inserted into the depressed portions 12. This fixedly secures the cream solder CS after being heated and melting. The fixedly secured solder S bonds the first board 10 to the support pillar 30 and electrically connects the metal film M to the support pillar 30.

Subsequently, the electronic components 50 are mounted on the first surface 10a and the cover 40 is bonded to the second board 20 by, for example, the resistance welding. This houses the first board 10 within the cover 40. The electronic device 100 is manufactured by the above-described process. The case where the conductive adhesive is used instead of the solder S is almost similar to the above-described process, except that in this case, the conductive adhesive may be fixedly secured by baking.

With such manufacturing method for the electronic device 100, in an operation of arranging the cream solder CS in a bonding process of the support pillars 30 and the first board 10, it is only necessary to arrange the cream solder CS on the surfaces of the depressed portions 12. Accordingly, in the electronic device 100, it is not necessary to form connection electrodes on which the cream solders CS are placed in the regions around the depressed portions 12 on the first surface 10a.

In the above-described bonding process, since the operation of arranging the cream solder CS is performed before the support pillars 30 are inserted into the depressed portions 12, the support pillars 30 do not obstruct the arranging operation. Operations, such as determining the arrangement of the cream solder CS and cleaning, can be similarly performed before the support pillars 30 are inserted into the depressed portions 12. This ensures easily and reliably performing the operations regarding the arrangement of the cream solder CS, and eventually it is possible to automate the bonding process including these operations using machines.

As described above, with the electronic device 100 according to the embodiment, the number and the types of the mountable electronic components 50 can be increased on the first surface 10a and a freedom of designing the wiring pattern 11 can be improved. The electronic device 100 is easily manufacturable.

First Modification

Figure 5A:
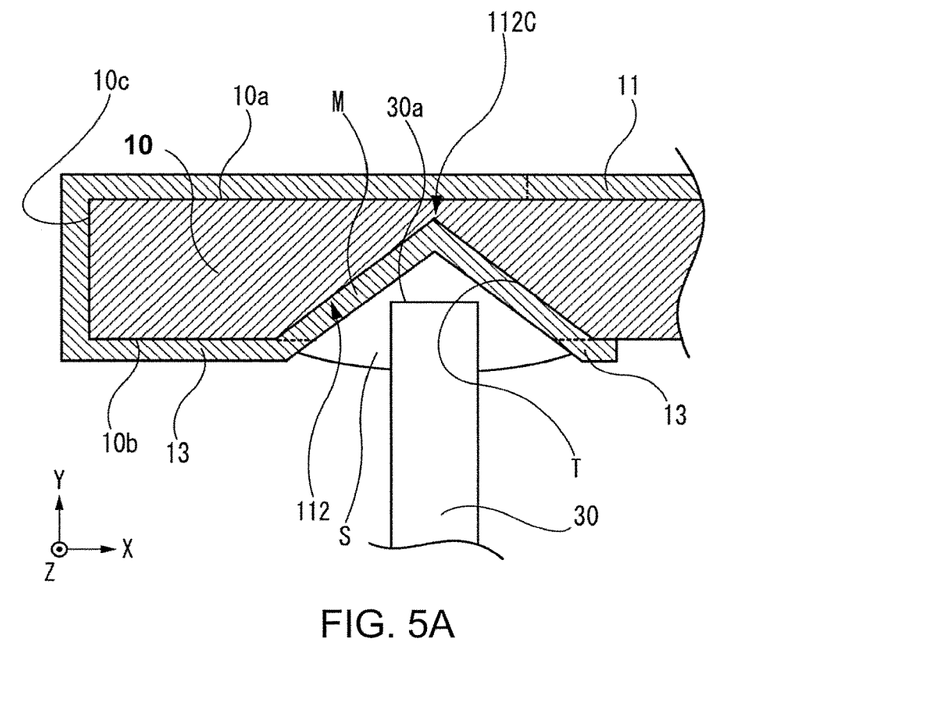
FIG. 5A is a cross-sectional view illustrating a configuration of a depressed portion according to a first modification.
Figure 5B:
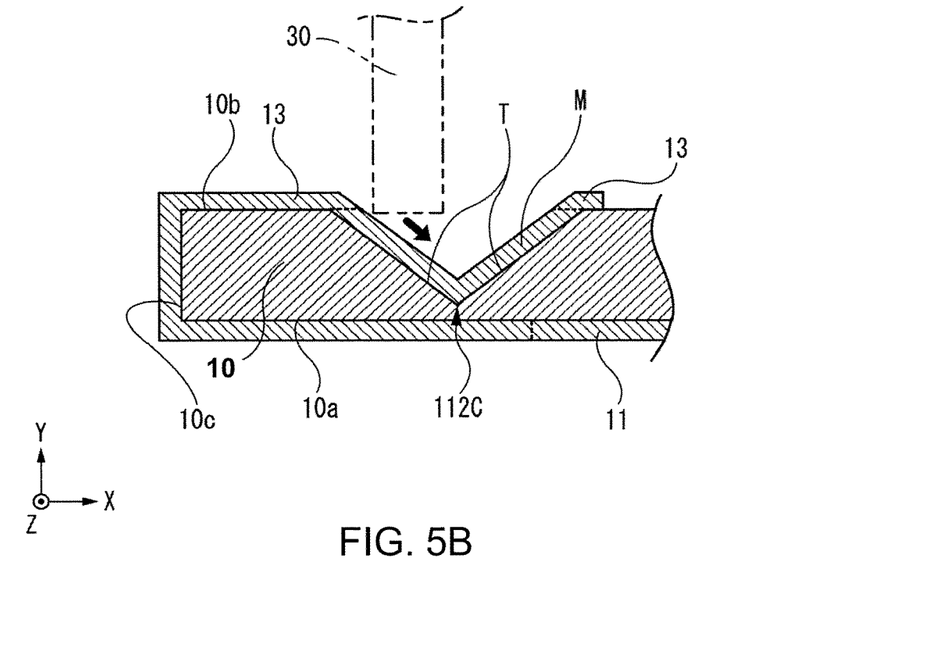
FIG. 5B is a drawing for explaining a movement of a support pillar inserted in the depressed portion.

Next, the following describes a configuration of a modification relates to the depressed portion 12 of the first board 10 in the electronic device 100 of the above-described first embodiment. In the following description, a component that is identical or equal to that of the above-described embodiment is indicated by the identical reference numeral, and the description thereof is omitted or simplified. FIG. 5A is a cross-sectional view illustrating a portion including the depressed portion 112 according to a first modification. FIG. 5B is a drawing explaining a movement of the support pillar 30 inserted into the depressed portion 112.

As illustrated in FIG. 5A, the depressed portion 112 according to the first modification has a configuration of a tapered surface T that inclines toward a center portion 112C from the back surface 10b (which is also referred to as "second surface 10b") of the first board 10. The depressed portion 112 does not pass through the first board 10 and is formed so as to gradually decrease its diameter from a side of the back surface 10b to a side of the front surface 10a. In view of this, an opening region of the depressed portion 112 viewed from the Y-direction is larger in the back surface 10b side than the center portion 112C.

The depressed portion 112 is formed to be, for example, a perfect circular shape viewing from the Y-direction. An inclination angle of the tapered surface T of the depressed portion 112 with respect to the XZ-plane is constant. The tapered surface T has a symmetrical shape with respect to a straight line that extends in the Y-direction passing through a center of the depressed portion 112. In view of this, a cross-sectional shape of the depressed portion 112 taken along an XY-plane is approximately an isosceles triangle shape that has a bottom parallel with the XZ-plane and an apex arranged on the +Y-side. While such tapered surface T of the depressed portion 112 is formed by drilling using a drill whose distal end angle is configured to be an angle identical to the inclination angle of the tapered surface T, the tapered surface T may be formed by another mechanical processing, thermal processing, chemical processing, or similar processing. The tapered surface T is not limited to the above-described configuration, and the tapered surface T may have the outer edge shape viewed from the Y-direction in an oval-like shape or an elliptical shape and may be formed so as to vary the inclination angle with respect to the XZ-plane.

In such bonding process of the first board 10 that includes the depressed portion 112 and the support pillar 30, even in the case where the distal end 30a of the support pillar 30 is off of the center portion 112C of the depressed portion 112 viewing from the Y-direction when the support pillar 30 is inserted into the depressed portion 112, the distal end 30a can be inserted into the depressed portion 112 simply by being brought relatively close to one another in the Y-direction insofar as the distal end 30a is included within the opening region on the back surface 10b side of the depressed portion 112.

In the above-described bonding process, in the case where the support pillar 30 is in a state of being off of the center portion 112C viewing from the Y-direction when the support pillar 30 is inserted into the depressed portion 112, the support pillar 30 may be pushed further inward of the depressed portion 112, or the reflow process may be performed in this state.

In the case where the support pillar 30 is pushed inward of the depressed portion 112, as illustrated in FIG. 5B, the distal end 30a of the support pillar 30 is guided by the tapered surface T to be led to the center portion 112C. This arranges the support pillar 30 above the center portion 112C of the depressed portion 112. In this respect, the first board 10 and the second board 20 are in a state of being relatively positioned with accuracy and are physically connected via the support pillar 30 in this state.

On the other hand, in the case where the reflow process is performed in a state where the support pillar 30 is at a position off of the center portion 112C viewing from the Y-direction, when the cream solder CS in the depressed portion 112 is disposed so as to have a uniform surface, the support pillar 30 is centered and led to the center portion 112C by the effect of the surface tension of the cream solder CS heated and melting (see FIG. 2). This arranges the support pillar 30 above the center portion 112C of the depressed portion 112. In this respect, the first board 10 and the second board 20 are in a state of being relatively positioned with accuracy and are physically connected via the support pillar 30 in this state.

Especially in the case where all the distances from the above-described distal ends 30a of the four support pillars 30 in the +Y-side to the bottom portions (end portions on the +Y-side) of the respective corresponding depressed portions 112 are not identical, when the support pillar 30 having the shortest distance abuts on the bottom portion of the depressed portion 112, the other support pillars 30 cannot be inserted further inward of the depressed portion 112, thus the distal ends 30a cannot be abutted on and guided by the tapered surface T. However, even the other support pillars 30 in such states can be disposed above the center portions 112C of the depressed portions 112 by being centered by the above-described effect of the surface tension of the melted solder, not by the guiding effect of the tapered surface T.

The cream solder CS applied over the depressed portion 112 includes remaining flux and water vapor. Therefore, the cream solder CS generates a void inside when heated by the reflow process. Such void remaining inside the solder causes a formation of a blowhole in the fixedly secured solder S. However, since the depressed portion 112 is formed to include the tapered surface T and to gradually increase the diameter from the bottom portion (the end portion on the +Y-side) to the front surface 10a of the first board 10, a clearance is formed between the depressed portion 112 and the support pillar 30. In view of this, even when the void is generated in the cream solder CS inside the depressed portion 112, the void is discharged via this clearance to restrict the formation of the blowhole. Furthermore, the depressed portion 112 includes the metal film M over the whole internal surface. Therefore, in the reflow process, the melted cream solder CS flows into the clearance between the support pillar 30 and the depressed portion 112 along the surface of the metal film M, and the solder S is gaplessly filled into the depressed portion 112. Accordingly, the bonding strength between the support pillar 30 and the depressed portion 112 using the solder S can be ensured.

Second Modification

Figure 6A:
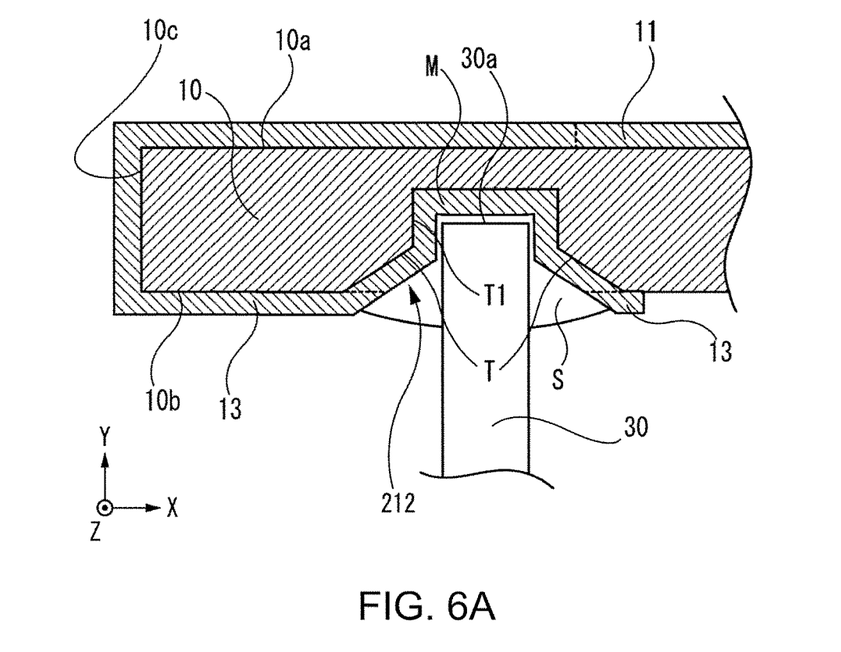
FIG. 6A is a cross-sectional view illustrating a configuration of a depressed portion according to a second modification.

Subsequently, a configuration of a second modification relating to the depressed portion 12 in the electronic device 100 will be described. In the following description, a component that is identical or equal to that of the above-described embodiment is indicated by the identical reference numeral, and the description thereof is omitted or simplified. FIG. 6A is a cross-sectional view illustrating a portion including a depressed portion 212 according to the second modification.

As illustrated in FIG. 6A, the depressed portion 212 according to the second modification includes the tapered surface T and a closed-bottom cylinder shaped surface T1 that further extends to the +Y-side from an end portion of the tapered surface T on the +Y-side. The closed-bottom cylinder shaped surface T1 is formed such that the inserted distal end 30a of the support pillar 30 is fittable. The depressed portion 212 includes the metal film M over a whole internal surface.

With such configuration of the depressed portion 212, including the tapered surface T provides an effect similar to the depressed portion 112 according to the above-described first modification and fitting the distal end 30a of the support pillar 30 in the closed-bottom cylinder shaped surface T1 ensures bonding the support pillar 30 to the depressed portion 212 in a state of restricting a relative movement of the support pillar 30 in the X-direction and the Z-direction with respect to the closed-bottom cylinder shaped surface T1.

Third Modification

Figure 6B:
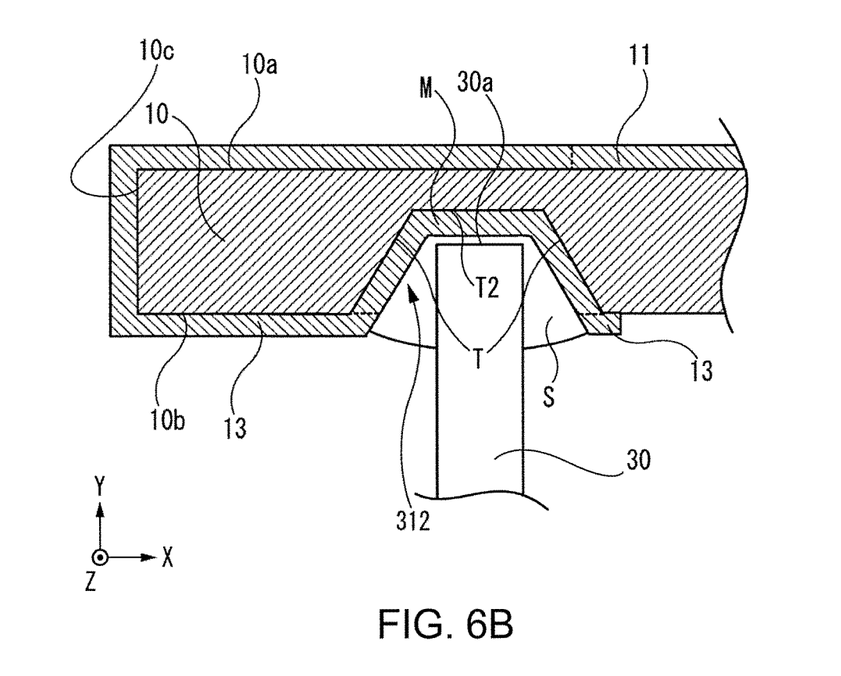
FIG. 6B is a cross-sectional view illustrating a configuration of a depressed portion according to a third modification.

Subsequently, a configuration of a third modification relating to the depressed portion 12 in the electronic device 100 will be described. In the following description, a component that is identical or equal to that of the above-described embodiment is indicated by the identical reference numeral, and the description thereof is omitted or simplified. FIG. 6B is a cross-sectional view illustrating a portion including a depressed portion 312 according to the third modification.

As illustrated in FIG. 6B, the depressed portion 312 according to the third modification includes the tapered surface T and a bottom surface T2 that is approximately parallel with the XZ-plane. The bottom surface T2 is formed to be contactable with the distal end 30a of the support pillar 30. The depressed portion 312 includes the metal film M over a whole internal surface. With such configuration of the depressed portion 312, including the tapered surface T provides the effect similar to the depressed portion 112 according to the above-described first modification and a depth (a dimension in the Y-direction) can be set short compared with the depressed portion 112 according to the first modification.

Second Embodiment

Figure 7:
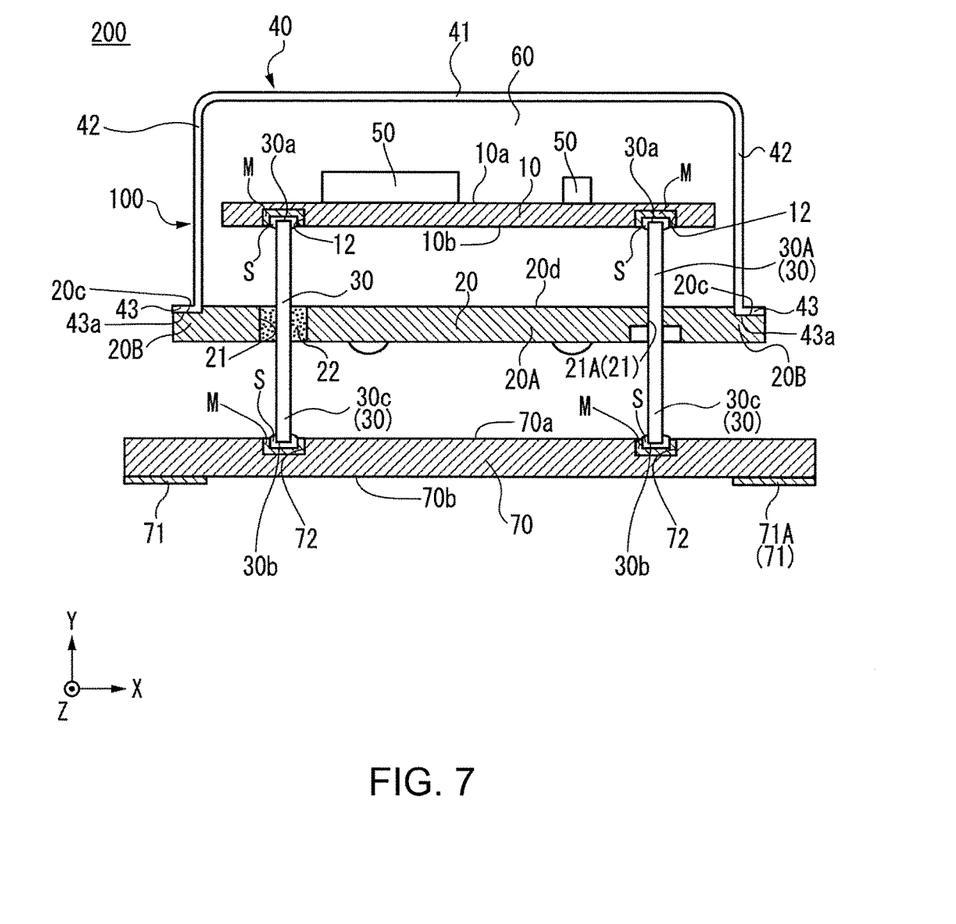
FIG. 7 is a schematic cross-sectional view illustrating an exemplary electronic device according to a second embodiment.

Subsequently, a second embodiment will be described with reference to FIG. 7. FIG. 7 is a cross-sectional view illustrating an example of an electronic device 200 according to the second embodiment. In FIG. 7, the wiring pattern 11 and the extraction electrode 13 are omitted similarly to FIG. 1A and FIG. 1B. In the following description, a component that is identical or equal to that of the first embodiment is indicated by the identical reference numeral, and the description thereof is omitted or simplified.

As illustrated in FIG. 7, the electronic device 200 includes a configuration of the electronic device 100 according to the above-described first embodiment and a third board 70. The electronic device 200 has a configuration in which the third board 70 is bonded to the outer lead 30c of the electronic device 100. This embodiment changes the above-described configuration of the electronic device 100 from the so-called lead inserting type (THD) into the surface mount type (Surface Mount Device: SMD).

The third board 70 is disposed on the −Y-side with respect to the configuration of the electronic device 100. The third board 70 is a board that is mounted on a printed board (not illustrated) of an electronic product in which the electronic device 200 is mounted. The third board 70 is formed in an approximately rectangular shape. A longitudinal direction of the third board 70 is parallel with the X-direction. A short side direction of the third board 70 is parallel with the Z-direction. A front surface (a surface on the +Y-side) 70a and a back surface (a surface on the −Y-side) 70b of the third board 70 are parallel with the XZ-plane. For the third board 70, similar to the above-described first board 10, the glass epoxy board is used, however, the third board 70 is not limited to the glass epoxy board, and the ceramic board or similar board may be used. The third board 70 may be formed of a material identical to that of the first board 10 or a material different from that of the first board 10 may be used. On the third board 70, the electronic components may be mounted on the surface. In this case, the wiring pattern that is electrically connected to the electronic component is disposed on the third board 70.

On the front surface 70a of the third board 70, hole portions 72 are formed. These hole portions 72 are disposed at positions corresponding to the outer leads 30c of the electronic device 100. For example, the hole portions 72 are disposed at four respective corner portions on the front surface 70a of the third board 70. The hole portion 72 is formed such that a distal end (an end portion on the −Y-side) 30b of the outer lead 30c is insertable. The hole portion 72 has a configuration similar to the depressed portion 12 of the first board 10 in the above-described first embodiment. The hole portion 72 may have a configuration different from the depressed portion 12. In this case, the hole portion 72 may have a configuration similar to the depressed portions 112 to 312 according to the first to the third modifications described above or may have a configuration of a through hole passing through the third board 70 in the Y-direction.

In the hole portions 72 of the third board 70, the respective distal ends 30b of the outer leads 30c are inserted. A length of the outer lead 30c may be adjusted as necessary such that a height (a length in the Y-direction) of the electronic device 200 falls within predetermined dimensions. The outer lead 30c is bonded to the third board 70 and electrically connected to the metal film M with the solder S in a state where the distal end 30b is inserted in the hole portion 72. Bonding of the support pillar 30 and the third board 70 is not limited to using the solder S, for example, a conductive adhesive constituted of the conductive resin or similar material may be used instead of the solder S.

The back surface 70b of the third board 70 includes external connection terminals 71. For example, the four external connection terminals 71 are disposed. The external connection terminal 71 has a configuration of a metal film similar to the above-described metal film M. The external connection terminal 71 is used for, for example, supplying power source, outputting, and ground connection. Among these, an external connection terminal 71A on the +X-side and +Z-side is a ground connecting terminal electrically connected to the support pillar 30A on the +X-side and +Z-side. The external connection terminals 71 are electrically connected to the metal film M via the respective extraction electrodes (not illustrated).

Such electronic device 200 is formed by, for example, inserting the distal end 30b of the outer lead 30c of the electronic device 100 into the hole portion 72 of the third board 70 and bonding the outer lead 30c and the hole portion 72 with the solder S in this state. Such bonding process may be performed by a process similar to the bonding process of the first board 10 and the support pillar 30 as described above. That is, the bonding process may be performed by a process in which, first, the cream solder CS is disposed on the surface of the hole portion 72, next, the distal end 30b of the outer lead 30c is inserted into the hole portion 72, and furthermore, the reflow process is performed in this state.

With such electronic device 200 according to the second embodiment, the effect similar to the electronic device 100 according to the first embodiment is provided, and the electronic device 200 is mountable to the printed board of the electronic product by surface mounting.

The embodiments have been described above. However, this disclosure is not limited to the above-described description, and various changes may be made without departing from the spirit and scope of the disclosure. For example, the configurations of the above-described embodiments or modifications may be replaced with the configurations of other embodiments or modifications, and may be combined with the configurations of the above-described embodiments or modifications.

In the first embodiment, the second board 20 may have a configuration similar to the third board 70 in the second embodiment. The electronic device in this case has a configuration of the surface mount type (SMD), not the lead inserting type (THD). The configuration of this electronic device ensures a profile lower than the electronic device 200 according to the second embodiment.

While in the above-described embodiments, the description has been made using the oven controlled crystal oscillator as an example of the electronic devices 100 and 200, the electronic devices 100 and 200 are not limited to the oven controlled crystal oscillator, but may be other kinds of electronic devices, such as a temperature compensation type crystal controlled oscillator (TCXO) and a voltage controlled crystal oscillator (VCXO).

In the first aspect of the disclosure, the first board may include an extraction electrode that is routed from the first surface to the second surface, and the electronic component may be electrically connected to the support pillars via the extraction electrode. The depressed portion may have a tapered surface that inclines toward a center portion of the depressed portion. The depressed portion may be formed with a metal film over a whole internal surface.

With this disclosure, not forming a through hole and a connection electrode on the first surface widens a mounting region for the electronic components and a formation region for a wiring pattern. This can increase the number and types of the mountable electronic components on the first surface and improve a freedom of designing the wiring pattern.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. An electronic device, comprising:
  a first board;
  a second board comprising through holes; and
  support pillars that hold the first board and the second board mutually separated, wherein
  the support pillars extend through the through holes,
  the first board has a first surface on which an electronic component is mounted, and
  the first board has a second surface including depressed portions into which the support pillars that extend from the second board are inserted,
  each of the depressed portions has a configuration of a non-through hole that does not pass through the first board, and
  the depressed portion has a tapered surface that inclines toward a center portion of the depressed portion and a bottom surface located at the center portion of the depressed portion that is substantially parallel with respect to a plane parallel to the first surface,
  wherein the bottom surface is larger than an end of the support pillar to be inserted into the depressed portion when view from a direction perpendicular to the bottom surface.

2. The electronic device according to claim 1, wherein the depressed portion is formed with a metal film over a whole internal surface.

3. An electronic device, comprising:
  a first board;
  a second board comprising through holes; and
  support pillars that hold the first board and the second board mutually separated, wherein
  the support pillars extend through the through holes,
  the first board has a first surface on which an electronic component is mounted,
  the first board has a second surface including depressed portions into which the support pillars that extend from the second board are inserted,
  the first board includes an extraction electrode that is routed from the first surface to the second surface through an internal layer pattern within the first board, and
  the electronic component is electrically connected to the support pillars via the extraction electrode,
  each of the depressed portions has a configuration of a non-through hole that does not pass through the first board, and
  the depressed portion has a tapered surface that inclines toward a center portion of the depressed portion.

* * * * *